(12) United States Patent
Nazarian et al.

(10) Patent No.: US 7,061,306 B2
(45) Date of Patent: *Jun. 13, 2006

(54) VOLTAGE BOOSTER

(75) Inventors: Hagop A. Nazarian, San Jose, CA (US); Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/137,941

(22) Filed: May 26, 2005

(65) Prior Publication Data

US 2005/0219902 A1    Oct. 6, 2005

Related U.S. Application Data

(63) Continuation of application No. 10/701,141, filed on Nov. 4, 2003, now Pat. No. 6,930,536.

(51) Int. Cl.
*G05F 1/10*   (2006.01)

(52) U.S. Cl. .................................................. 327/536

(58) Field of Classification Search ................ 327/530, 327/534, 536, 537
See application file for complete search history.

(56) References Cited

U.S. PATENT DOCUMENTS

| | | | |
|---|---|---|---|
| 5,489,870 A * | 2/1996 | Arakawa | ..................... 327/536 |
| 5,740,106 A | 4/1998 | Nazarian | |
| 5,801,579 A | 9/1998 | Le et al. | |
| 5,844,840 A * | 12/1998 | Le et al. | ................. 365/185.23 |
| 5,852,576 A | 12/1998 | Le et al. | |
| 5,909,396 A | 6/1999 | Le et al. | |
| 5,939,928 A | 8/1999 | Le et al. | |
| 5,999,459 A | 12/1999 | Liu | |
| 6,064,602 A | 5/2000 | Liu | |
| 6,081,455 A | 6/2000 | Le et al. | |
| 6,147,914 A | 11/2000 | Leung et al. | |
| 6,157,242 A | 12/2000 | Fukui | |
| 6,184,726 B1 | 2/2001 | Haeberli et al. | |
| 6,292,048 B1 | 9/2001 | Li | |
| 6,307,425 B1 | 10/2001 | Chevallier et al. | |
| 6,370,075 B1 | 4/2002 | Haeberli et al. | |
| 6,512,698 B1 | 1/2003 | Kamei | |
| 6,674,317 B1 | 1/2004 | Chou | |
| 6,816,411 B1 * | 11/2004 | Arai et al. | ............. 365/185.17 |
| 2002/0163836 A1 | 11/2002 | Tanzawa | |

* cited by examiner

*Primary Examiner*—Jeffrey Zweizig
(74) *Attorney, Agent, or Firm*—Leffert Jay & Polglaze, PA; Thomas W. Leffert (57) ABSTRACT

Voltage boosters or pass circuits for generating a boosted voltage are advantageous in the decoding and programming of memory devices and, in particular, NAND flash memory devices. The boosted voltage can be used as a gate voltage for a pass gate providing programming voltages to a selected block of memory cells, such as in a NAND flash memory array. The pass circuits facilitate the elimination of high-voltage p-channel devices by providing a boosted voltage using n-channel devices. The pass circuits further permit control of multiple pass gates using a single boosted voltage source.

64 Claims, 4 Drawing Sheets

VOLTAGE BOOSTER

RELATED APPLICATIONS

This is a Continuation application of U.S. patent application Ser. No. 10/701,141 filed Nov. 4, 2003 and titled, VOLTAGE BOOSTER, now U.S. Pat. No. 6,930,536, issued Aug. 16, 2005, which is commonly assigned, and the entire contents of which are incorporated herein by reference.

TECHNICAL FIELD OF THE INVENTION

The present invention relates generally to integrated circuit devices and, in particular, to voltage boosters and pass circuits for the decoding and passing of programming voltages in memory devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of floating-gate memory device that can be erased and reprogrammed. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

An advantage of NAND flash architecture is that it facilitates a smaller array size due in part to a smaller word line pitch. However, programming voltages of NAND flash architecture are generally higher than those of NOR flash architecture.

Because the programming voltages of NAND flash architecture are generally several times the supply potential, it becomes difficult to pass these high-voltage control signals through the circuit without loss. In general, an n-channel field-effect transistor (nFET) with a positive Vt requires a gate voltage higher than the voltage being applied to its drain in order to pass the drain voltage to the source.

Voltages higher than the supply potential are typically generated internally to a memory device using a charge pump or other voltage generator. Because a voltage generator is required for each voltage concurrently utilized by the device, it is preferable to minimize the number of voltage levels required by the device.

Memory devices generally include some type of boost circuit to provide sufficient gate voltage to an nFET passing the high programming voltage. While the gate voltage must generally be above the programming voltage by a value equal to the threshold voltage, Vt, of the nFET, higher gate voltages will permit correct operating voltages and improved programming speed.

For the reasons stated above, and for other reasons stated below which will become apparent to those skilled in the art upon reading and understanding the present specification, there is a need in the art for alternate methods and circuits for passing high-voltage control signals in an integrated circuit device.

SUMMARY OF THE INVENTION

The above-mentioned problems with memory devices and other problems are addressed by the present invention and will be understood by reading and studying the following specification.

The various embodiments of the invention include voltage boosters or pass circuits for generating a boosted voltage as well as methods of boosting a voltage and apparatus for using such boosted voltages. The boosted voltage can be used as a gate voltage for a pass gate providing programming voltages to a selected block of memory cells, such as in a NAND flash memory array. The pass circuits facilitate the elimination of high-voltage p-channel devices by providing a boosted voltage using n-channel devices. Decoder circuits utilizing such pass circuits are expected to be smaller in size due to the elimination of an N-well from the decoder area. The pass circuits further permit control of multiple pass gates using a single boosted voltage source.

The invention provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
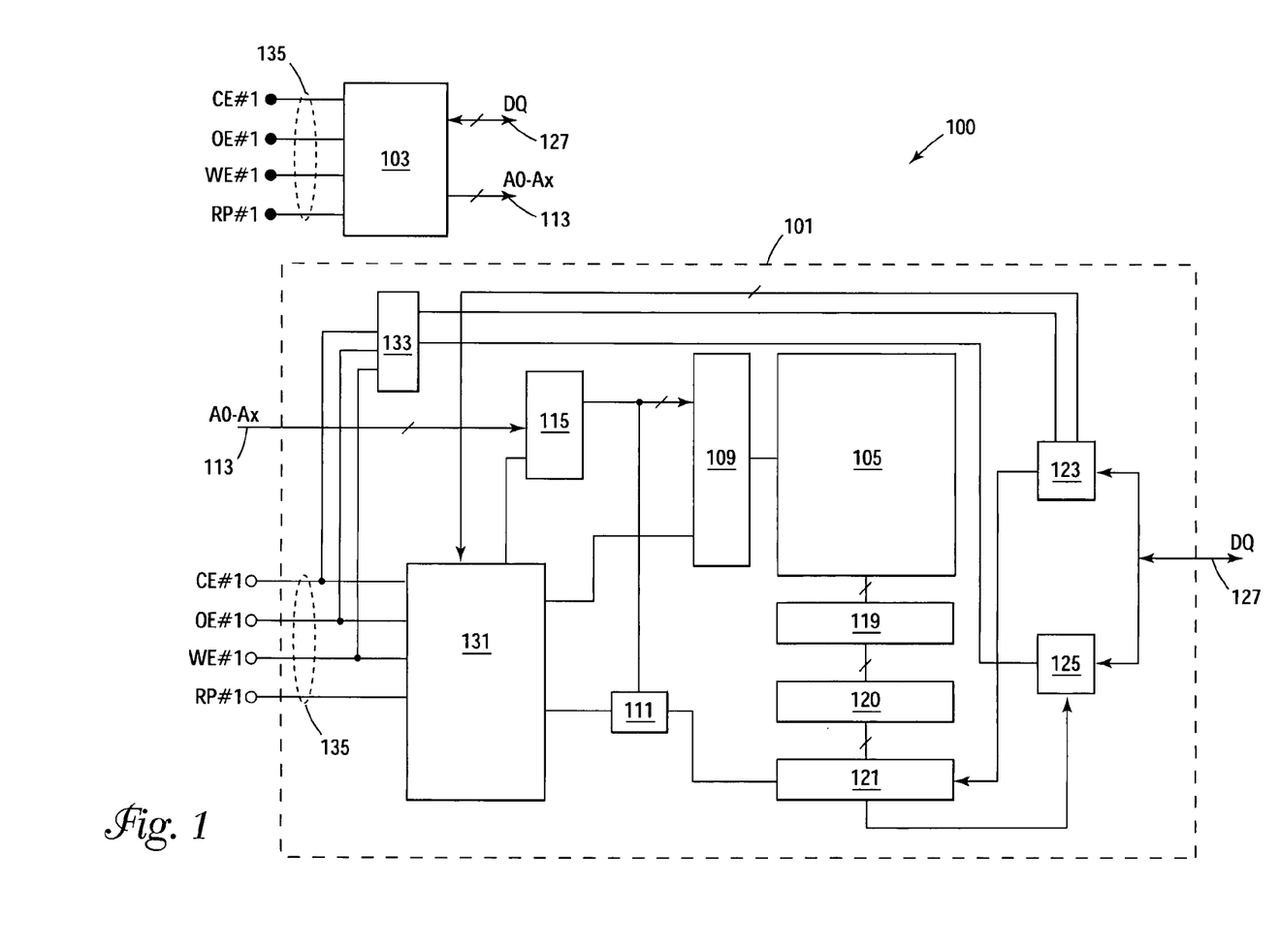
FIG. 1 is a functional block diagram of a basic flash memory device in accordance with an embodiment of the invention coupled to a processor.

FIG. 1 is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of non-volatile memory cells 105. The memory array 105 may utilize an NAND flash architecture.

Each memory cell is thus located at an intersection of a word line and a local bit line. The memory array 105 is arranged in rows and columns, with the rows arranged in blocks. A memory block is some discrete portion of the memory array 105. Individual word lines generally extend to only one memory block while bit lines may extend to multiple memory blocks. The memory cells generally can be erased in blocks. Data, however, may be stored in the memory array 105 separate from the block structure.

A row and block decoder 109 and a column decoder 111 are provided to decode address signals provided on address lines A0–Ax 113. The row and block decoder 109 includes at least one pass gate in accordance with an embodiment of the invention. An address buffer circuit 115 is provided to latch the address signals. Address signals are received and decoded to access the memory array 105. Sense and latch circuitry 119 act as sense amplifiers during read and data input program operations. The number of the latches in the sense and latch circuitry is usually the same as the number of bits per page of the memory array 105. Cache latches 120 interface to the I/O through the column decoder multiplexers 121. Data is loaded into the cache latches 120, or read from the cache latches 120, through the column decoder multiplexers 121. The cache latches 120 provide pipelining by permitting data loaded into the sense and latch circuitry 119 to be written to the memory array 105 while concurrently loading new data into the cache latches 120, thereby improving the programming data rate. The column decoder multiplexers 121 select one or more columns of the data from the cache latches 120 in response to control signals from the column decoder 111.Input buffer circuit 123 and output buffer circuit 125 are included for bi-directional data communication over a plurality of data (DQ) lines 127 with the processor 103.

Command control circuit 131 decodes signals provided on control lines 135 from the processor 103. These signals are used to control the operations on the memory array 105, including data read, data write, and erase operations. Input/output control circuit 133 is used to control the input buffer circuit 123 and the output buffer circuit 125 in response to some of the control signals. As stated above, the flash memory device 101 has been simplified to facilitate a basic understanding of the features of the memory. A more detailed understanding of flash memories is known to those skilled in the art. As is well known, such memory devices 101 may be fabricated as integrated circuits on a semiconductor substrate.

Figure 2:
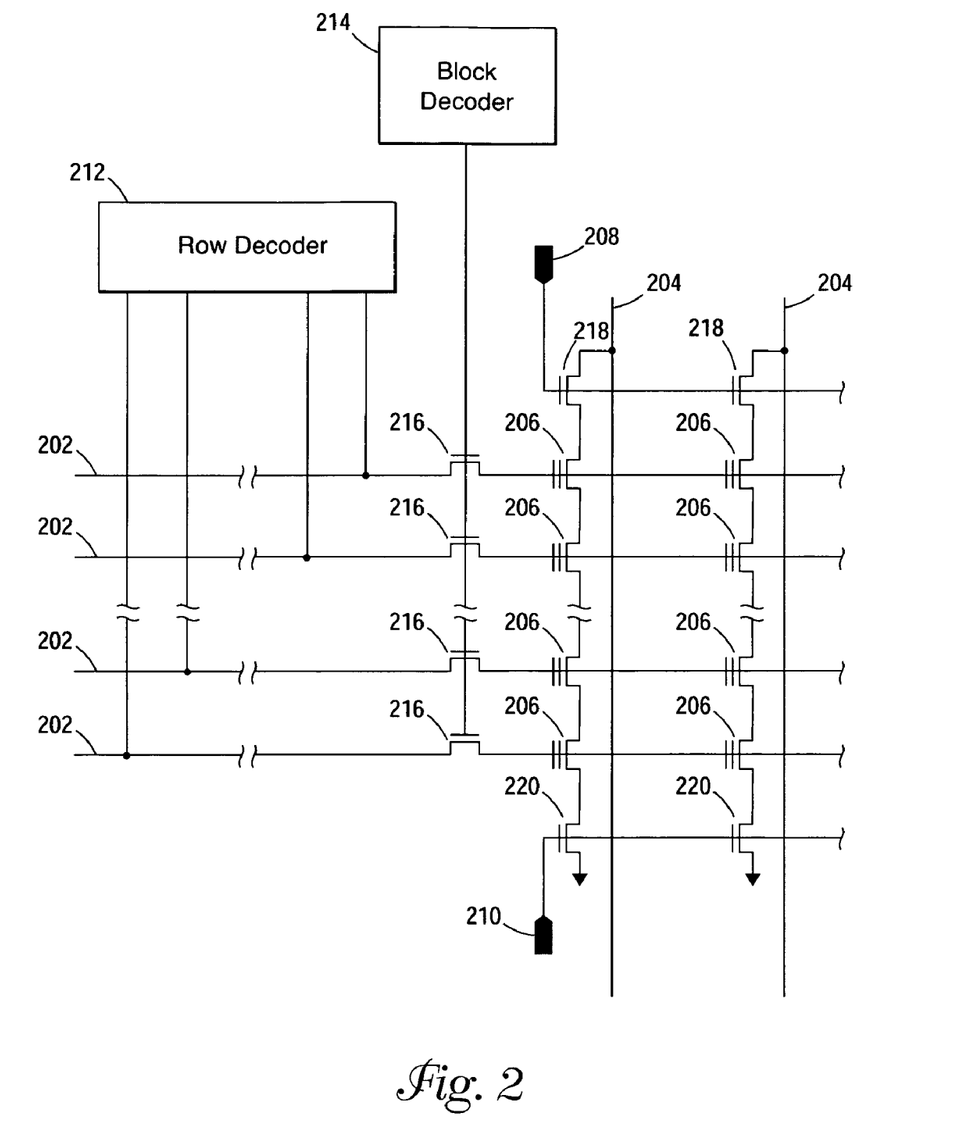
FIG. 2 is a schematic of a portion of a block of a memory array in accordance with an embodiment of the invention.

FIG. 2 is a schematic of a portion of a block of the memory array. The memory array contains floating-gate memory cells 206 coupled in a NAND configuration, i.e., memory cells 206 coupled in series strings, with a first memory cell 206 selectively coupled to a bit line 204 through a string select transistor, such as nFET 218. The nFETs 218 are responsive to a control signal received on node 208. Similarly, the last memory cell 206 is selectively coupled to a node 222 through a ground select transistor, such as nFET 220. The nFETs 220 are responsive to a control signal received on node 210.

The word lines 202 receive programming voltages in response to the row decoder 212. Typically, in programming a NAND flash memory device, a selected word line 202 will receive a programming voltage, Vpp, while unselected word lines 202 will receive an intermediate voltage, Vm, between the supply voltage Vcc and the programming voltage Vpp. As an example, the programming voltage Vpp may be approximately 15V–20V while the intermediate voltage Vm may be approximately 10V.

The word lines 202 are selectively coupled to the memory cells 206 through pass gates, such as nFETs 216. To efficiently pass the programming voltages Vpp from the word lines 202 to the gates of the selected row of memory cells 206, the pass gates 216 are provided with a boosted gate voltage Vpp+ from the block decoder 214. The boosted gate voltage Vpp+ is preferably at least one threshold voltage Vt of the pass gates 216 above the programming voltage Vpp.

Figure 3A:
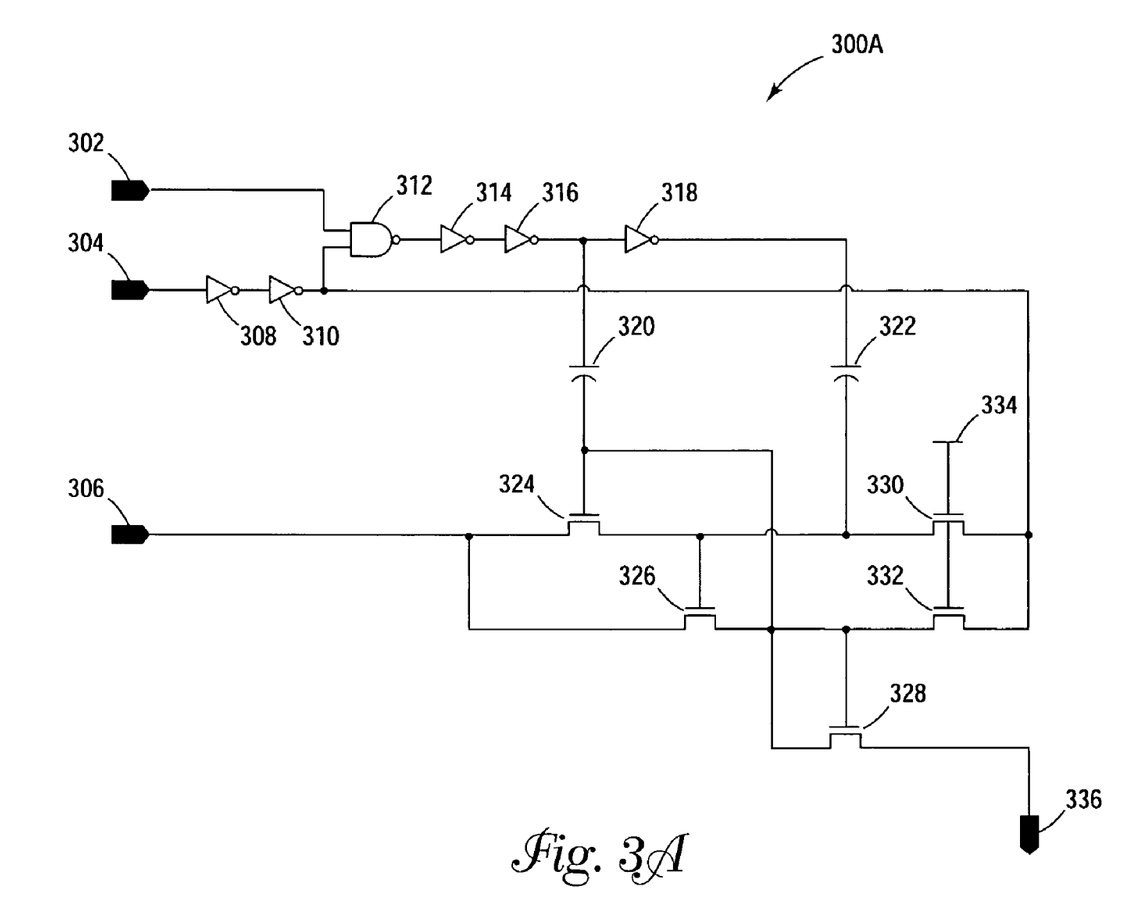
FIG. 3A is a schematic of a voltage booster or pass circuit in accordance with one embodiment of the invention.

The boosted gate voltage Vpp+ is generated by a pass circuit that can be considered as part of the block decoder 214, although it may be responsive to the block decoder 214 without being part of the decoder itself. FIG. 3A is a schematic of a voltage booster or pass circuit 300A in accordance with one embodiment of the invention.

The pass circuit 300A includes an input node 306 for receiving the programming voltage Vpp and an output node 336 for providing a boosted voltage Vpp+. It should be noted that while the discussion is in the context of the programming voltage Vpp for a flash memory device, the pass circuit 300A may be used to provide a voltage at its output node 336 that is boosted from a voltage at its input node 306, regardless of the application. For one embodiment, the output node 336 represents the output of the block decoder 214 of FIG. 2.

The pass circuit 300A further includes a first capacitor 320 coupled to receive a CLK* signal at a first terminal and a second capacitor 322 coupled to receive a CLK signal that is the complement of the CLK* signal at its first terminal. While these clock signals may be coupled directly to the capacitors 320 and 322, the pass circuit 300A is depicted to include circuitry for selectively activating or deactivating the pass circuit 300A.

In the embodiment depicted in FIG. 3A, selective activation is facilitated by providing a block select signal to the node 304 as a first input to the NAND gate 312. The block select signal may be buffered, such as passing it through the series-connected inverters 308 and 310. The second input of the NAND gate 312 is coupled to node 302 to receive a clock signal CLK. By setting the block select signal to a logic high value, e.g., the supply voltage Vcc, the output of the NAND gate 312 is responsive to the clock signal on node 302, thus activating the pass circuit 300A. By setting the block select signal to a logic low value, e.g., the ground potential Vss, the output of the NAND gate 312 is forced to a logic high, thus deactivating the pass circuit 300A. While the various embodiments are described using a clock signal having an amplitude equal to Vcc, other amplitudes could also be used. Additionally, it is noted that other combinatorial logic could be utilized in place of the logic gates of the pass circuit 300A to apply the appropriate voltages for proper operation of the boost circuitry as described herein.

When activated, the output of the NAND gate 312, having the clock signal CLK applied to its second output, is the complementary clock signal CLK*. The clock signal CLK* may be buffered, such as passing it through the series-connected inverters 314 and 316. The output of the inverter 316 is then provided to the capacitor 320 as the clock signal CLK*. The clock signal CLK* at the output of the inverter 316 is then inverted by the inverter 318 and provided to the capacitor 322 as the clock signal CLK.

A first n-channel field-effect transistor (nFET) 324 has a gate coupled to a second terminal of the capacitor 320, a first source/drain region coupled to the node 306 and a second source/drain region coupled to the gate of the second nFET 326. The second nFET 326 has a first source/drain region coupled to the first source/drain region of the first nFET 324 and a second source/drain region coupled to the gate of a third nFET 328. The third nFET 328 has a first source/drain region coupled to its gate and a second source/drain region coupled to the output node 336.

A fourth nFET 330 has its gate coupled to a node 334, a first source/drain region coupled to a second terminal of the second capacitor 322 and a second source/drain region coupled to receive the block select signal or other activation signal. A fifth nFET 332 has its gate coupled to the node 334, a first source/drain region coupled to the gate of the third nFET 328 and a second source/drain region coupled to receive the block select signal or other activation signal. Node 334 is coupled to receive a supply voltage, such as Vcc.

Upon activation at node 304, the gates of the nFETs 324, 326 and 328 will be brought up to a voltage substantially equal to the voltage level of the block select signal minus the threshold voltages of the associated nFETs 330 and 332, i.e., Vcc−Vt. The nFETs 324, 326 and 328 will thus be activated, allowing at least the voltage of node 306, i.e., Vpp, to pass to node 336. As the clock signals CLK and CLK* cycle, capacitive coupling will pull up the potential levels to the gates of the nFETs 324, 326 and 328.

The potential level to the gate of the nFET 328 will reach a maximum value approximately equal to:

$$Vpp+Vcc*k_1;$$

where $k_1 \approx C_{320}/(C_{320}+C_{324}+C_{328}+Cj_{328}+C_{out})$
$C_{320}$=capacitance of the capacitor 320
$C_{324}$=gate capacitance of the nFET 324
$C_{328}$=gate capacitance of the nFET 328
$Cj_{328}$=junction capacitance of nFET 328
$C_{out}$=output capacitance at node 336

It is noted, however, that $Cj_{328}$ can generally be assumed to have an insignificant impact on the value of $k_1$.

The potential level to the gate of the nFET 326 will reach a maximum value approximately equal to:

$$Vpp+Vcc*k_2;$$

where $k_2 \approx C_{322}/(C_{322}+C_{326}+Cj_{324}+Cj_{330})$
$C_{322}$=capacitance of the capacitor 322
$C_{326}$=gate capacitance of the nFET 326
$Cj_{324}$=junction capacitance of the nFET 324
$Cj_{330}$=junction capacitance of the nFET 330

It is noted, however, that $Cj_{324}$ and $Cj_{330}$ can generally be assumed to have an insignificant impact on the value of $k_2$.

To pass the potential from the input node 306 to the output node 336, $Vcc*k_1$ must be at least equal to the Vt of the third nFET 328 and $Vcc*k_2$ must be at least equal to the Vt of the second nFET 326. These constraints determine the minimum sizing of the capacitors 320 and 322. However, to generate a boosted voltage at the output node 336, the capacitors 320 and 322 should be sized such that $Vcc*k_1$ is greater than the Vt of the third nFET 328 and $Vcc*k_2$ is greater than the Vt of the second nFET 326. It is more preferable that the capacitor 320 be sized such that $Vcc*k_1 >= Vt$ of nFET 328+Vt of the pass gate it is expected to control, thereby permitting the pass gate to fully pass Vpp.

Figure 3B:
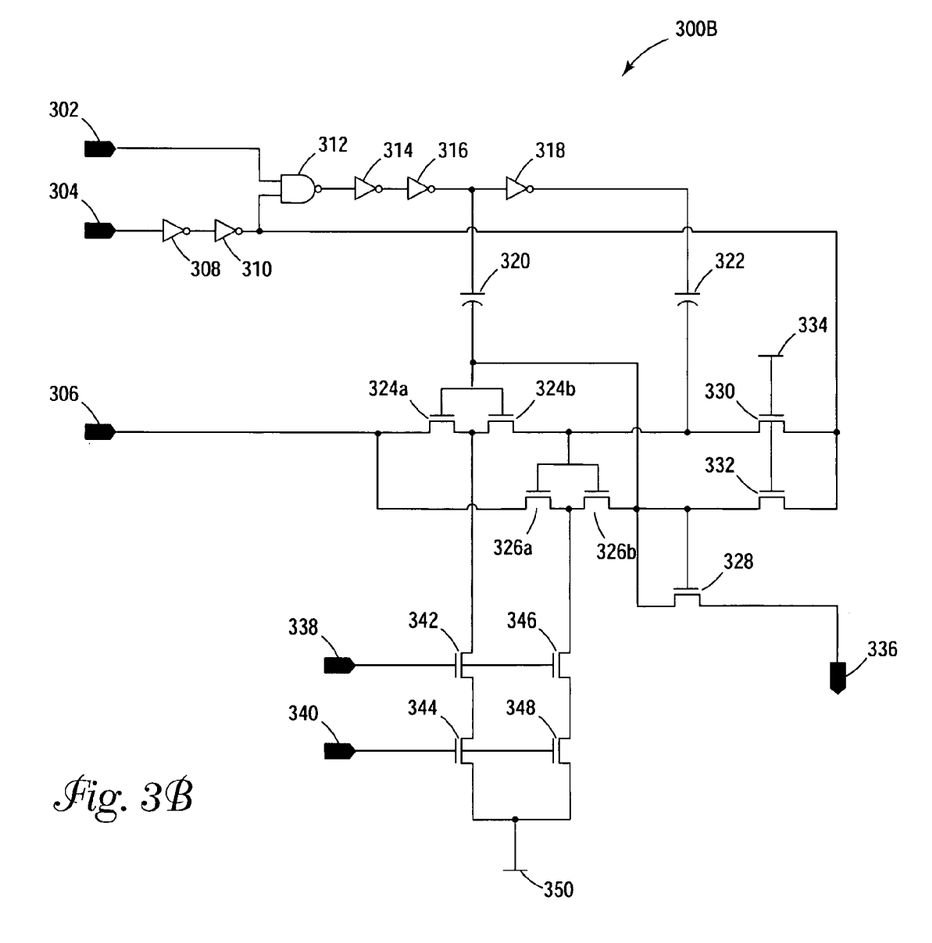
FIG. 3B is a schematic of a voltage booster or pass circuit in accordance with an further embodiment of the invention.

Improvements in efficiency of the boost circuitry can be realized by utilizing low-Vt transistors in the pass circuit. This can be accomplished by replacing the nFETs 324 and 326 of the pass circuit 300A with series-connected low-Vt transistors. Low-Vt transistors can have threshold voltages in the range of 0.2V to 0.3V. Therefore, the same potential can be passed to the output node while applying lower boosted voltages to the gates of the transistors. The efficiency of the boost circuitry is thus improved as it can operate at lower internal gate voltages of, e.g., nFETs 324a, 324b, 326a, 326b and 328. FIG. 3B is a schematic of a pass circuit 300B in accordance with an embodiment of the invention facilitating the use of low-Vt transistors. It is noted that the use of series-connected transistors in the pass circuit 300B can also result in reduced current leakage during deactivation of the pass circuit.

Many of the components of pass circuit 300B are described with reference to the pass circuit 300A and will not be repeated here. Activation of the pass circuit 300B in response to a block select signal at node 304 occurs as described with reference to pass circuit 300A. In place of nFET 324, a pair of series-connected nFETs 324a and 324b are used. The pair of series-connected nFETs 324a and 324b has their common source/drain region selectively coupled to a potential node 350, such as through nFETs 342 and 344 or other selective coupling device. The nFET 342 is coupled to receive a control signal from node 338 to control is activation. The nFET 344 is coupled to receive a control signal from node 340 to control its activation.

In place of nFET 326, a pair of series-connected nFETs 326a and 326b are used. The pair of series-connected nFETs 326a and 326b has their common source/drain region selectively coupled to the potential node 350, such as through nFETs 346 and 348 or other selective coupling device. The nFET 346 is coupled to receive a control signal from node 338 to control is activation. The nFET 348 is coupled to receive a control signal from node 340 to control its activation. The potential node 350 is coupled to receive the supply voltage Vcc.

During deactivation of the pass circuit 300B, the gates of the nFET pair 324a/324b will be pulled to the ground potential Vss through the nFET 332. By coupling the shared source/drain regions of the nFET pair 324a/324b to the supply voltage Vcc, the gate-source voltage $V_{GS}$ for the nFET 324a will be negative, thus reducing current leakage from node 306. The $V_{GS}$ of the nFET 324b will be higher than that of the nFET 324a at approximately zero volts. However, it will still be deactivated and any current leakage through this nFET will generally be from the supply voltage at node 350 as opposed to the Vpp source at node 306.

Similarly, during deactivation of the pass circuit 300B, the gates of the nFET pair 326a/326b will be pulled to the ground potential Vss through the nFET 330. By coupling the shared source/drain regions of the nFET pair 326a/326b to the supply voltage Vcc, the gate-source voltage $V_{GS}$ for the nFET 326a will be negative, thus reducing current leakage from node 306. The $V_{GS}$ of the nFET 326b will be higher than that of the nFET 326a at approximately zero volts. However, it will still be deactivated and any current leakage through this nFET will generally be from the supply voltage at node 350 as opposed to the Vpp source at node 306.

For the pass circuit 300B, the potential level to the gate of the nFET 328 will reach a maximum value approximately equal to:

$$Vpp+Vcc*k_1;$$

where $k_1 \approx C_{320}/(C_{320}+C_{324a}+C_{324b}+C_{328}+Cj_{328}+C_{out})$
$C_{320}$=capacitance of the capacitor 320
$C_{324a}$=gate capacitance of the nFET 324a
$C_{324b}$=gate capacitance of the nFET 324b
$C_{328}$=gate capacitance of the nFET 328
$Cj_{328}$=junction capacitance of the nFET 324
$C_{out}$=output capacitance at node 336

It is noted, however, that $Cj_{328}$ can generally be assumed to have an insignificant impact on the value of $k_1$.

For the pass circuit 300B, the potential level to the gates of the nFETs 326a and 326b will reach a maximum value approximately equal to:

$$Vpp+Vcc*k_2;$$

where $k_2 \approx C_{322}/(C_{322}+C_{326a}+C_{326b})$
$C_{322}$=capacitance of the capacitor 322
$C_{326a}$=gate capacitance of the nFET 326a
$C_{326b}$=gate capacitance of the nFET 326b
$Cj_{324b}$=junction capacitance of the nFET 324
$Cj_{330}$=junction capacitance of the nFET 330

It is noted, however, that $Cj_{324b}$ and $Cj_{330}$ can generally be assumed to have an insignificant impact on the value of $k_2$.

To pass the potential from the input node 306 to the output node 336, $Vcc*k_1$ must be at least equal to the Vt of the third nFET 328 and $Vcc*k_2$ must be at least equal to the Vt of the second nFETs 326a and 326b. These constraints determine the minimum sizing of the capacitors 320 and 322. However, to generate a boosted voltage at the output node 336, the first capacitor 320 and the second capacitor 322 should be sized such that $Vcc*k_1$ is greater than the Vt of the third nFET 328 and $Vcc*k_2$ is greater than the Vt of the second nFETs 326a and 326b. It is more preferable that the capacitor 320 be sized such that $Vcc*k_1 \geq$ Vt of nFET 328+Vt of the pass gate it is expected to control, thereby permitting the pass gate to fully pass Vpp.

In operation, a programming command will be received by a memory device from a processor or other controller. The command will be accompanied by a location address identifying the memory cells to be programmed. After latching the address signals, the address will be decoded to identify the target block. The block decoder will generate the control signal indicative of a desire to access a block of memory cells. The control signal, i.e., the block select signal, will have a first logic level for selected blocks and a second logic level for unselected blocks. The pass circuits for selected blocks will be activated, thereby generating the boosted voltage Vpp+ at their output for control of the pass gates on the word lines of the memory array. Rows of the selected blocks will then receive the voltage applied to their respective word lines, i.e., Vpp for selected word lines and a lower voltage for unselected word lines.

In the various embodiments of the invention, by providing a voltage boosted from Vpp, a single pass circuit can be used to activate pass gates for multiple rows of a selected block. This is advantageous over local pass circuits where each pass gate of each row of the block is provided with its own pass circuit. Using pass circuits of the type described herein, a single pass circuit can provide a gate voltage to a number of pass gates where that gate voltage has a potential level that exceeds Vpp by at least the Vt of the pass gate. This will permit a clean passing of the programming voltage to the memory cells without requiring individual pass circuits for each row.

CONCLUSION

Pass circuits for generating a voltage boosted from an input voltage are provided herein. Methods of operating these pass circuits, especially in relation to their use in controlling pass gates for NAND flash memory devices, are also provided herein. By providing a programming voltage as an input to the pass circuit and boosting it at least one Vt of the pass gates above the programming voltage, the resulting boosted voltage may be used to control multiple pass gates, e.g., each pass gate of a selected block of memory cells, while still permitting an unreduced programming voltage to be applied to the selected memory cells of the selected block of memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of boosting a programming voltage, comprising:
   applying a first voltage to a first source/drain region of a first transistor and a first source/drain region of a second transistor while the first and second transistors are activated;
   applying a voltage from a second source/drain region of the first transistor to a gate of a third transistor and a first source/drain region of a fourth transistor, wherein the voltage from the second source/drain region of the first transistor is sufficient to activate the third transistor;
   applying a voltage from a second source/drain region of the second transistor to a first source/drain region of the third transistor, to a gate of the fourth transistor and to a gate and a first source/drain region of a fifth transistor, wherein the voltage from the second source/drain region of the second transistor is sufficient to activate the fourth and fifth transistors;
   applying the programming voltage to a second source/drain region of the third transistor and a second source/drain region of the fourth transistor;
   applying a first clock signal to a first terminal of a first capacitor, wherein the gates of the fourth and fifth transistors are coupled to a second terminal of the first capacitor;

applying a second clock signal to a first terminal of a second capacitor, wherein the gate of the third transistor is coupled to a second terminal of the second capacitor and wherein the second clock signal is a complement of the first clock signal;

generating a boosted voltage at a second source/drain region of the fifth transistor that is higher than the programming voltage.

2. The method of claim 1, wherein the first and second capacitors are sized such that the boosted voltage is greater than the programming voltage plus a threshold voltage of a transistor coupled to receive the boosted voltage.

3. The method of claim 1, wherein the first capacitor is sized to have a capacitance such that an amplitude of the first clock signal times a first constant is greater than a threshold voltage of the fifth transistor, wherein the first constant is equal to:

$$C_1/(C_1+C_2+C_3+C_4)$$

where $C_1$=a capacitance of the first capacitor;
$C_2$=a gate capacitance of the fourth transistor;
$C_3$=a gate capacitance of the fifth transistor; and
$C_4$=a capacitance at the second source/drain region of the fifth transistor.

4. The method of claim 3, wherein the first capacitor is sized to have a capacitance such that the amplitude of the first clock signal times the first constant is greater than the threshold voltage of the fifth transistor plus a threshold voltage of a transistor coupled to receive the boosted voltage.

5. The method of claim 1, wherein the first voltage is a supply voltage and wherein the first voltage is applied to gates of the first and second transistors.

6. The method of claim 1, wherein the first and second clock signals each have an amplitude equal to the first voltage.

7. The method of claim 1, wherein the first, second, third, fourth and fifth transistors are n-channel field-effect transistors.

8. A method of boosting a programming voltage, comprising:

applying a first voltage to a first source/drain region of a first transistor and a first source/drain region of a second transistor while the first and second transistors are activated;

applying a voltage from a second source/drain region of the first transistor to gates of a third transistor and a fourth transistor and to a first source/drain region of a fifth transistor, wherein the voltage from the second source/drain region of the first transistor is sufficient to activate the third and fourth transistors;

applying a voltage from a second source/drain region of the second transistor to a first source/drain region of the third transistor, to a gate of the fifth transistor, to a gate of a sixth transistor and to a gate and a first source/drain region of a seventh transistor, wherein the voltage from the second source/drain region of the second transistor is sufficient to activate the fifth, sixth and seventh transistors;

applying the programming voltage to a first source/drain region of the sixth transistor and a first source/drain region of the fourth transistor, wherein a second source/drain region of the sixth transistor is coupled to a second source/drain region of the fifth transistor and a second source/drain region of the fourth transistor is coupled to a second source/drain region of the third transistor;

applying a first clock signal to a first terminal of a first capacitor, wherein the gates of the fifth, sixth and seventh transistors are coupled to a second terminal of the first capacitor;

applying a second clock signal to a first terminal of a second capacitor, wherein the gates of the third and fourth transistors are coupled to a second terminal of the second capacitor and wherein the second clock signal is a complement of the first clock signal;

generating a boosted voltage at a second source/drain region of the seventh transistor that is higher than the programming voltage.

9. The method of claim 8, wherein the first and second capacitors are sized such that the boosted voltage is greater than the programming voltage plus a threshold voltage of a transistor coupled to receive the boosted voltage.

10. The method of claim 8, wherein the first capacitor is sized to have a capacitance such that an amplitude of the first clock signal times a first constant is greater than a threshold voltage of the seventh transistor, wherein the first constant is equal to:

$$C_1/(C_1+C_2+C_3+C_4+C_5)$$

where $C_1$=a capacitance of the first capacitor;
$C_2$=a gate capacitance of the fifth transistor;
$C_3$=a gate capacitance of the sixth transistor;
$C_4$=a gate capacitance of the seventh transistor; and
$C_5$=a capacitance at a second source/drain region of the seventh transistor.

11. The method of claim 10, wherein the first capacitor is sized to have a capacitance such that the amplitude of the first clock signal times the first constant is greater than the threshold voltage of the seventh transistor plus a threshold voltage of a transistor coupled to receive the boosted voltage.

12. The method of claim 8, wherein the first voltage is a supply voltage and wherein the first voltage is applied to gates of the first and second transistors.

13. The method of claim 8, wherein the first and second clock signals each have an amplitude equal to the first voltage.

14. The method of claim 8, wherein the first, second, third, fourth, fifth, sixth and seventh transistors are n-channel field-effect transistors.

15. A memory device, comprising:

an array of memory cells arranged in rows and columns, with pluralities of rows of memory cells grouped in blocks;

a row decoder providing gate potentials to rows of the array of memory cells;

pass gates coupled between the row decoder and the rows of the array of memory cells for selectively passing the gate potentials to their associated rows of the array of memory cells;

a block decoder for selecting a target block of memory cells in response to a location address, wherein the block decoder comprises a pass circuit for controlling the pass gates of each block of the array of memory cells, each pass circuit comprising:

a first capacitor having a first terminal for receiving a first clock signal and having a second terminal;

a second capacitor having a first terminal for receiving a second clock signal and having a second terminal, wherein the second clock signal is complementary to the first clock signal;

a first n-channel field-effect transistor (nFET) having a gate, a first source/drain region and a second source/ drain region, wherein the gate is coupled to the second terminal of the first capacitor and the first source/drain region is coupled to receive a programming voltage;

a second nFET having a gate, a first source/drain region and a second source/drain region, wherein the gate is coupled to the second source/drain region of the first nFET and the second terminal of the second capacitor, and the first source/drain region is coupled to the first source/drain region of the first nFET; and a third nFET having a gate, a first source/drain region and a second source/drain region, wherein the gate is coupled to the gate of the first nFET and the second source/drain region of the second nFET, the first source/drain region is coupled to the gate of the first nFET and the second source/drain region of the second nFET, and the second source/drain region is coupled to the associated pass gates.

16. The memory device of claim 15, wherein each pass circuit further comprises:

a fourth nFET having a gate, a first source/drain region and a second source/drain region, wherein the gate is coupled to receive a supply voltage, the first source/drain region is coupled to the second terminal of the second capacitor and the second source/drain region is coupled to receive a control signal; and a fifth nFET having a gate, a first source/drain region and a second source/drain region, wherein the gate is coupled to receive the supply voltage, the first source/drain region is coupled to the gate of the third nFET and the second source/drain region is coupled to receive the control signal.

17. The memory device of claim 16, wherein the first and second clock signals are derived from a single clock signal.

18. The memory device of claim 17, wherein the control signal and the single clock signal are provided to a logic gate for selectively activating and deactivating at least one of the pass circuits.

19. The memory device of claim 18, wherein the logic gate is a NAND gate.

20. The memory device of claim 15, wherein the array of memory cells comprises floating-gate memory cells arranged in a NAND flash architecture.

21. The memory device of claim 15, wherein the first capacitor of each pass circuit is sized to provide a boosted voltage at the gate of its third nFET at least equal to a value of the programming voltage plus a threshold voltage of that third nFET.

22. The memory device of claim 15, wherein the first capacitor of each pass circuit is sized to have a capacitance such that an amplitude of the first clock signal times a first constant is greater than a threshold voltage of the third nFET, wherein the first constant is equal to:

$$C_1/(C_1+C_2+C_3+C_4)$$

where $C_1$ = a capacitance of the first capacitor;
$C_2$ = a gate capacitance of the first nFET;
$C_3$ = a gate capacitance of the third nFET; and
$C_4$ = a capacitance at the output of the pass circuit.

23. The memory device of claim 22, wherein the first capacitor of each pass circuit is sized to have a capacitance such that the amplitude of the first clock signal times the first constant is greater than the threshold voltage of the third nFET plus a threshold voltage of an associated pass gate coupled to the second source/drain region of that third nFET.

24. The memory device of claim 15, wherein the array of memory cells comprises non-volatile floating-gate memory cells and wherein the memory cells of each column are coupled in series strings, with a first memory cell of each string selectively coupled to a bit line.

25. A memory device, comprising:

an array of memory cells arranged in rows and columns, with pluralities of rows of memory cells grouped in blocks;

a row decoder providing gate potentials to rows of the array of memory cells;

pass gates coupled between the row decoder and the rows of the array of memory cells for selectively passing the gate potentials to their associated rows of the array of memory cells;

a block decoder for selecting a target block of memory cells in response to a location address, wherein the block decoder comprises a pass circuit for controlling the pass gates of each block of the array of memory cells, each pass circuit comprising:

a first input for receiving a clock signal;

a second input for receiving a control signal indicative of whether the associated block is selected;

a third input for receiving a programming voltage;

an output coupled to the associated pass gates;

a logic gate having a first input coupled to the first input of the pass circuit, a second input coupled to the second input of the pass circuit, and an output;

a first inverter having an input coupled to the output of the logic gate and an output;

a first capacitor having a first terminal coupled to the output of the logic gate and having a second terminal;

a second capacitor having a first terminal coupled to the output of the first inverter and having a second terminal;

a first n-channel field-effect transistor (nFET) having a gate, a first source/drain region and a second source/drain region, wherein the gate is coupled to the second terminal of the first capacitor and the first source/drain region is coupled to receive a programming voltage;

a second nFET having a gate, a first source/drain region and a second source/drain region, wherein the gate is coupled to the second source/drain region of the first nFET and the second terminal of the second capacitor, and the first source/drain region is coupled to the first source/drain region of the first nFET; and a third nFET having a gate, a first source/drain region and a second source/drain region, wherein the gate is coupled to the gate of the first nFET and the second source/drain region of the second nFET, the first source/drain region is coupled to the gate of the first nFET and the second source/drain region of the second nFET, and the second source/drain region is coupled to the associated pass gates.

26. The memory device of claim 25, wherein each pass circuit further comprises:

a fourth nFET having a gate, a first source/drain region and a second source/drain region, wherein the gate is coupled to receive a supply voltage, the first source/drain region is coupled to the second terminal of the second capacitor and the second source/drain region is coupled to receive a control signal; and a fifth nFET having a gate, a first source/drain region and a second source/drain region, wherein the gate is coupled to receive the supply voltage, the first source/ drain region is coupled to the gate of the third nFET and the second source/drain region is coupled to receive the control signal.

27. The memory device of claim 26, wherein each pass circuit further comprises:
a second inverter and a third inverter coupled in series and interposed between the second input of the pass circuit and the second input of the logic gate, wherein the second and third inverters are further interposed between the second input of the pass circuit and the second source/drain regions of the fourth and fifth nFETs.

28. The memory device of claim 27, wherein each pass circuit further comprises:
a fourth inverter and a fifth inverter coupled in series and interposed between the output of the logic gate and the input of the first inverter, wherein the fourth and fifth inverters are further interposed between the output of the logic gate and the first terminal of the first capacitor.

29. The memory device of claim 25, wherein the logic gate of each pass circuit is a NAND gate.

30. The memory device of claim 25, wherein the first capacitor of each pass circuit is sized to have a capacitance such that an amplitude of the first clock signal times a first constant is greater than a threshold voltage of the third nFET, wherein the first constant is equal to:

$$C_1/(C_1+C_2+C_3+C_4)$$

where $C_1$=a capacitance of the first capacitor;
$C_2$=a gate capacitance of the first nFET;
$C_3$=a gate capacitance of the third nFET; and
$C_4$=a capacitance at the output of the pass circuit.

31. The memory device of claim 30, wherein the first capacitor of each pass circuit is sized to have a capacitance such that the amplitude of the first clock signal times the first constant is greater than the threshold voltage of the third nFET plus a threshold voltage of an associated pass gate coupled to the output of the pass circuit.

32. The memory device of claim 25, wherein the array of memory cells comprises non-volatile floating-gate memory cells and wherein the memory cells of each column are coupled in series strings, with a first memory cell of each string selectively coupled to a bit line.

33. An electronic system, comprising:
a processor; and
a memory device coupled to the processor, the memory device comprising:
an array of memory cells arranged in rows and columns, with pluralities of rows of memory cells grouped in blocks;
a row decoder providing gate potentials to rows of the array of memory cells;
pass gates coupled between the row decoder and the rows of the array of memory cells for selectively passing the gate potentials to their associated rows of the array of memory cells;
a block decoder for selecting a target block of memory cells in response to a location address, wherein the block decoder comprises a pass circuit for controlling the pass gates of each block of the array of memory cells, each pass circuit comprising:
a first capacitor having a first terminal for receiving a first clock signal and having a second terminal;
a second capacitor having a first terminal for receiving a second clock signal and having a second terminal, wherein the second clock signal is complementary to the first clock signal;
a first n-channel field-effect transistor (nFET) having a gate, a first source/drain region and a second source/drain region, wherein the gate is coupled to the second terminal of the first capacitor and the first source/drain region is coupled to receive a programming voltage;
a second nFET having a gate, a first source/drain region and a second source/drain region, wherein the gate is coupled to the second source/drain region of the first nFET and the second terminal of the second capacitor, and the first source/drain region is coupled to the first source/drain region of the first nFET; and
a third nFET having a gate, a first source/drain region and a second source/drain region, wherein the gate is coupled to the gate of the first nFET and the second source/drain region of the second nFET, the first source/drain region is coupled to the gate of the first nFET and the second source/drain region of the second nFET, and the second source/drain region is coupled to the associated pass gates.

34. The electronic system of claim 33, wherein each pass circuit further comprises:
a fourth nFET having a gate, a first source/drain region and a second source/drain region, wherein the gate is coupled to receive a supply voltage, the first source/drain region is coupled to the second terminal of the second capacitor and the second source/drain region is coupled to receive a control signal; and
a fifth nFET having a gate, a first source/drain region and a second source/drain region, wherein the gate is coupled to receive the supply voltage, the first source/drain region is coupled to the gate of the third nFET and the second source/drain region is coupled to receive the control signal.

35. The electronic system of claim 34, wherein the first and second clock signals are derived from a single clock signal.

36. The electronic system of claim 35, wherein the control signal and the single clock signal are provided to a logic gate for selectively activating and deactivating at least one of the pass circuits.

37. The electronic system of claim 36, wherein the logic gate is a NAND gate.

38. The electronic system of claim 33, wherein the array of memory cells comprises floating-gate memory cells arranged in a NAND flash architecture.

39. The electronic system of claim 33, wherein the first capacitor of each pass circuit is sized to provide a boosted voltage at the gate of its third nFET at least equal to a value of the programming voltage plus a threshold voltage of that third nFET.

40. The electronic system of claim 33, wherein the first capacitor of each pass circuit is sized to have a capacitance such that an amplitude of the first clock signal times a first constant is greater than a threshold voltage of the third nFET, wherein the first constant is equal to:

$$C_1/(C_1+C_2+C_3+C_4)$$

where $C_1$=a capacitance of the first capacitor;
$C_2$=a gate capacitance of the first nFET;
$C_3$=a gate capacitance of the third nFET; and
$C_4$=a capacitance at the output of the pass circuit.

41. The electronic system of claim 40, wherein the first capacitor of each pass circuit is sized to have a capacitance such that the amplitude of the first clock signal times the first constant is greater than the threshold voltage of the third nFET plus a threshold voltage of an associated pass gate coupled to the second source/drain region of that third nFET.

42. The electronic system of claim 33, wherein the array of memory cells comprises non-volatile floating-gate memory cells and wherein the memory cells of each column are coupled in series strings, with a first memory cell of each string selectively coupled to a bit line.

43. An electronic device, comprising:
a processor; and
a memory device coupled to the processor, the memory device comprising:
an array of memory cells arranged in rows and columns, with pluralities of rows of memory cells grouped in blocks;
a row decoder providing gate potentials to rows of the array of memory cells;
pass gates coupled between the row decoder and the rows of the array of memory cells for selectively passing the gate potentials to their associated rows of the array of memory cells;
a block decoder for selecting a target block of memory cells in response to a location address, wherein the block decoder comprises a pass circuit for controlling the pass gates of each block of the array of memory cells, each pass circuit comprising:
a first input for receiving a clock signal;
a second input for receiving a control signal indicative of whether the associated block is selected;
a third input for receiving a programming voltage;
an output coupled to the associated pass gates;
a logic gate having a first input coupled to the first input of the pass circuit, a second input coupled to the second input of the pass circuit, and an output;
a first inverter having an input coupled to the output of the logic gate and an output;
a first capacitor having a first terminal coupled to the output of the logic gate and having a second terminal;
a second capacitor having a first terminal coupled to the output of the first inverter and having a second terminal;
a first n-channel field-effect transistor (nFET) having a gate, a first source/drain region and a second source/drain region, wherein the gate is coupled to the second terminal of the first capacitor and the first source/drain region is coupled to receive a programming voltage;
a second nFET having a gate, a first source/drain region and a second source/drain region, wherein the gate is coupled to the second source/drain region of the first nFET and the second terminal of the second capacitor, and the first source/drain region is coupled to the first source/drain region of the first nFET; and
a third nFET having a gate, a first source/drain region and a second source/drain region, wherein the gate is coupled to the gate of the first nFET and the second source/drain region of the second nFET, the first source/drain region is coupled to the gate of the first nFET and the second source/drain region of the second nFET, and the second source/drain region is coupled to the associated pass gates.

44. The electronic system of claim 43, wherein each pass circuit further comprises:

a fourth nFET having a gate, a first source/drain region and a second source/drain region, wherein the gate is coupled to receive a supply voltage, the first source/drain region is coupled to the second terminal of the second capacitor and the second source/drain region is coupled to receive a control signal; and
a fifth nFET having a gate, a first source/drain region and a second source/drain region, wherein the gate is coupled to receive the supply voltage, the first source/drain region is coupled to the gate of the third nFET and the second source/drain region is coupled to receive the control signal.

45. The electronic system of claim 44, wherein each pass circuit further comprises:
a second inverter and a third inverter coupled in series and interposed between the second input of the pass circuit and the second input of the logic gate, wherein the second and third inverters are further interposed between the second input of the pass circuit and the second source/drain regions of the fourth and fifth nFETs.

46. The electronic system of claim 45, wherein each pass circuit further comprises:
a fourth inverter and a fifth inverter coupled in series and interposed between the output of the logic gate and the input of the first inverter, wherein the fourth and fifth inverters are further interposed between the output of the logic gate and the first terminal of the first capacitor.

47. The electronic system of claim 43, wherein the logic gate of each pass circuit is a NAND gate.

48. The electronic system of claim 43, wherein the first capacitor of each pass circuit is sized to have a capacitance such that an amplitude of the first clock signal times a first constant is greater than a threshold voltage of the third nFET, wherein the first constant is equal to:

$$C_1/(C_1+C_2+C_3+C_4)$$

where $C_1$=a capacitance of the first capacitor;
$C_2$=a gate capacitance of the first nFET;
$C_3$=a gate capacitance of the third nFET; and
$C_4$=a capacitance at the output of the pass circuit.

49. The electronic system of claim 48, wherein the first capacitor of each pass circuit is sized to have a capacitance such that the amplitude of the first clock signal times the first constant is greater than the threshold voltage of the third nFET plus a threshold voltage of an associated pass gate coupled to the output of the pass circuit.

50. The electronic system of claim 43, wherein the array of memory cells comprises non-volatile floating-gate memory cells and wherein the memory cells of each column are coupled in series strings, with a first memory cell of each string selectively coupled to a bit line.

51. An electronic system, comprising:
a processor; and
a memory device coupled to the processor, wherein the memory device comprises:
an array of memory cells arranged in rows and columns, with pluralities of rows of memory cells grouped in blocks;
a row decoder providing gate potentials to rows of the array of memory cells;
pass gates coupled between the row decoder and the rows of the array of memory cells for selectively passing the gate potentials to their associated rows of the array of memory cells;
a block decoder for selecting a target block of memory cells in response to a location address, wherein the block decoder comprises a pass circuit for controlling the pass gates of each block of the array of memory cells, each pass circuit comprising:
a first capacitor having a first terminal for receiving a first clock signal and having a second terminal;
a second capacitor having a first terminal for receiving a second clock signal and having a second terminal, wherein the second clock signal is complementary to the first clock signal;
a first n-channel field-effect transistor (nFET) having a gate, a first source/drain region and a second source/drain region, wherein the gate is coupled to the second terminal of the first capacitor and the first source/drain region is coupled to receive a programming voltage;
a second nFET having a gate, a first source/drain region and a second source/drain region, wherein the gate is coupled to the second terminal of the first capacitor and the first source/drain region is coupled to the second source/drain region of the first nFET;
a third nFET having a gate, a first source/drain region and a second source/drain region, wherein the gate is coupled to the second source/drain region of the second nFET and the second terminal of the second capacitor, and the first source/drain region is coupled to the first source/drain region of the first nFET;
a fourth FET having a gate, a first source/drain region and a second source/drain region, wherein the gate is coupled to the second source/drain region of the second nFET and the second terminal of the second capacitor, the first source/drain region is coupled to the second source/drain region of the third nFET, and the second source/drain region is coupled to the gates of the first and second nFETs; and
a fifth nFET having a gate, a first source/drain region and a second source/drain region, wherein the gate is coupled to the gates of the first and second nFETs and the second source/drain region of the fourth nFET, the first source/drain region is coupled to the gates of the first, second and fifth nFETs and the second source/drain region of the fourth nFET, and the second source/drain region is coupled to the associated pass gates.

52. The electronic system of claim 51, wherein the array of memory cells comprises floating-gate memory cells arranged in a NAND flash architecture.

53. An electronic system, comprising:
a processor; and
a memory device coupled to the processor, the memory device comprising:
an array of memory cells arranged in rows and columns, with pluralities of rows of memory cells grouped in blocks;
a row decoder providing gate potentials to rows of the array of memory cells;
pass gates coupled between the row decoder and the rows of the array of memory cells for selectively passing the gate potentials to their associated rows of the array of memory cells;
a block decoder for selecting a target block of memory cells in response to a location address, wherein the block decoder comprises a pass circuit for controlling the pass gates of each block of the array of memory cells, each pass circuit comprising:
a first input for receiving a clock signal;
a second input for receiving a control signal indicative of whether the associated block is selected;
a third input for receiving a programming voltage;
an output coupled to the associated pass gates;
a logic circuit having a first input coupled to the first input of the pass circuit and a second input coupled to the second input of the pass circuit, wherein the logic circuit is adapted to provide complementary clock signals when the associated block is selected;
a first capacitor having a first terminal coupled to receive a first complementary clock signal and having a second terminal;
a second capacitor having a first terminal coupled to receive a second complementary clock signal and having a second terminal;
a first n-channel field-effect transistor (nFET) having a gate, a first source/drain region and a second source/drain region, wherein the gate is coupled to the second terminal of the first capacitor and the first source/drain region is coupled to the third input of the pass circuit;
a second nFET having a gate, a first source/drain region and a second source/drain region, wherein the gate is coupled to the second terminal of the first capacitor and the first source/drain region is coupled to the second source/drain region of the first nFET;
a third nFET having a gate, a first source/drain region and a second source/drain region, wherein the gate is coupled to the second source/drain region of the second nFET and the second terminal of the second capacitor, and the first source/drain region is coupled to the first source/drain region of the first nFET;
a fourth FET having a gate, a first source/drain region and a second source/drain region, wherein the gate is coupled to the second source/drain region of the second nFET and the second terminal of the second capacitor, the first source/drain region is coupled to the second source/drain region of the third nFET, and the second source/drain region is coupled to the gates of the first and second nFETs;
a fifth nFET having a gate, a first source/drain region and a second source/drain region, wherein the gate is coupled to the gates of the first and second nFETs and the second source/drain region of the fourth nFET, the first source/drain region is coupled to the gates of the first, second and fifth nFETs and the second source/drain region of the fourth nFET, and the second source/drain region is coupled to the output of the pass circuit;
a sixth nFET having a gate, a first source/drain region and a second source/drain region, wherein the gate is coupled to receive a supply voltage, the first source/drain region is coupled to the second terminal of the second capacitor and the second source/drain region is coupled to receive the control signal; and
a seventh nFET having a gate, a first source/drain region and a second source/drain region, wherein the gate is coupled to receive the supply voltage, the first source/drain region is coupled to the gate of the fifth nFET and the second source/drain region is coupled to receive the control signal.

54. The electronic system of claim 53, wherein the first capacitor of each pass circuit is sized to provide a boosted voltage at the gate of its fifth nFET at least equal to a value of the programming voltage plus a threshold voltage of that fifth nFET.

55. The electronic system of claim 53, wherein the first capacitor of each pass circuit is sized to have a capacitance such that an amplitude of the first clock signal times a first constant is greater than a threshold voltage of the fifth nFET, wherein the first constant is equal to:

$$C_1/(C_1+C_2+C_3+C_4+C_5)$$

where $C_1$=a capacitance of the first capacitor;
$C_2$=a gate capacitance of the first nFET;
$C_3$=a gate capacitance of the second nFET;
$C_4$=a gate capacitance of the fifth nFET; and
$C_5$=a capacitance at the output of the pass circuit.

56. The electronic system of claim 55, wherein the first capacitor of each pass circuit is sized to have a capacitance such that the amplitude of the first clock signal times the first constant is greater than the threshold voltage of the fifth nFET plus a threshold voltage of an associated pass gate coupled to the output of the pass circuit.

57. The electronic system of claim 53, wherein the array of memory cells comprises non-volatile floating-gate memory cells and wherein the memory cells of each column are coupled in series strings, with a first memory cell of each string selectively coupled to a bit line.

58. An electronic system, comprising:
a processor; and
a memory device coupled to the processor, the memory device comprising:
an array of memory cells arranged in rows and columns, with pluralities of rows of memory cells grouped in blocks;
a row decoder providing gate potentials to rows of the array of memory cells;
pass gates coupled between the row decoder and the rows of the array of memory cells for selectively passing the gate potentials to their associated rows of the array of memory cells;
a block decoder for selecting a target block of memory cells in response to a location address, wherein the block decoder comprises a pass circuit for controlling the pass gates of each block of the array of memory cells, each pass circuit comprising:
a first input for receiving a clock signal;
a second input for receiving a control signal indicative of whether the associated block is selected;
a third input for receiving a programming voltage;
an output coupled to the associated pass gates;
a logic gate having a first input coupled to the first input of the pass circuit, a second input coupled to the second input of the pass circuit, and an output;
a first inverter having an input coupled to the output of the logic gate and an output;
a first capacitor having a first terminal coupled to the output of the logic gate and having a second terminal;
a second capacitor having a first terminal coupled to the output of the first inverter and having a second terminal;
a first n-channel field-effect transistor (nFET) having a gate, a first source/drain region and a second source/drain region, wherein the gate is coupled to the second terminal of the first capacitor and the first source/drain region is coupled to the third input of the pass circuit;
a second nFET having a gate, a first source/drain region and a second source/drain region, wherein the gate is coupled to the second terminal of the first capacitor and the first source/drain region is coupled to the second source/drain region of the first nFET;
a third nFET having a gate, a first source/drain region and a second source/drain region, wherein the gate is coupled to the second source/drain region of the second nFET and the second terminal of the second capacitor, and the first source/drain region is coupled to the first source/drain region of the first nFET;
a fourth FET having a gate, a first source/drain region and a second source/drain region, wherein the gate is coupled to the second source/drain region of the second nFET and the second terminal of the second capacitor, the first source/drain region is coupled to the second source/drain region of the third nFET, and the second source/drain region is coupled to the gates of the first and second nFETs;
a fifth nFET having a gate, a first source/drain region and a second source/drain region, wherein the gate is coupled to the gates of the first and second nFETs and the second source/drain region of the fourth nFET, the first source/drain region is coupled to the gates of the first, second and fifth nFETs and the second source/drain region of the fourth nFET, and the second source/drain region is coupled to the output of the pass circuit;
a sixth nFET having a gate, a first source/drain region and a second source/drain region, wherein the gate is coupled to receive a supply voltage, the first source/drain region is coupled to the second terminal of the second capacitor and the second source/drain region is coupled to receive the control signal; and
a seventh nFET having a gate, a first source/drain region and a second source/drain region, wherein the gate is coupled to receive the supply voltage, the first source/drain region is coupled to the gate of the fifth nFET and the second source/drain region is coupled to receive the control signal.

59. The electronic system of claim 58, wherein each pass circuit further comprises:
a second inverter and a third inverter coupled in series and interposed between the second input of the pass circuit and the second input of the logic gate, wherein the second and third inverters are further interposed between the second input of the pass circuit and the second source/drain regions of the sixth and seventh nFETs.

60. The electronic system of claim 59, wherein each pass circuit further comprises:
a fourth inverter and a fifth inverter coupled in series and interposed between the output of the logic gate and the input of the first inverter, wherein the fourth and fifth inverters are further interposed between the output of the logic gate and the first terminal of the first capacitor.

61. The electronic system of claim 58, wherein the logic gate of each pass circuit is a NAND gate.

62. The electronic system of claim 58, wherein the first capacitor of each pass circuit is sized to have a capacitance such that an amplitude of the first clock signal times a first constant is greater than a threshold voltage of the fifth nFET, wherein the first constant is equal to:

$$C_1/(C_1+C_2+C_3+C_4+C_5)$$

where $C_1$=a capacitance of the first capacitor;
$C_2$=a gate capacitance of the first nFET;
$C_3$=a gate capacitance of the second nFET;
$C_4$=a gate capacitance of the fifth nFET; and
$C_5$=a capacitance at the output of the pass circuit.

63. The electronic system of claim 62, wherein the first capacitor of each pass circuit is sized to have a capacitance such that the amplitude of the first clock signal times the first constant is greater than the threshold voltage of the fifth nFET plus a threshold voltage of an associated pass gate coupled to the output of the pass circuit.

64. The electronic system of claim 58, wherein the array of memory cells comprises non-volatile floating-gate memory cells and wherein the memory cells of each column are coupled in series strings, with a first memory cell of each string selectively coupled to a bit line.

* * * * *